United States Patent
Berchtold (12)

(10) Patent No.: US 8,723,032 B2
(45) Date of Patent: May 13, 2014

(54) CONDUCTOR GRID FOR ELECTRONIC HOUSINGS AND MANUFACTURING METHOD

(75) Inventor: Lorenz Berchtold, Pforzheim (DE)

(73) Assignee: Tyco Electronics AMP GmbH, Bensheim (DE)

( * ) Notice: Subject to any disclaimer, the term of this patent is extended or adjusted under 35 U.S.C. 154(b) by 212 days.

(21) Appl. No.: 13/263,629

(22) PCT Filed: Mar. 29, 2010

(86) PCT No.: PCT/EP2010/054091
§ 371 (c)(1),
(2), (4) Date: Oct. 7, 2011

(87) PCT Pub. No.: WO2010/115746
PCT Pub. Date: Oct. 14, 2010

(65) Prior Publication Data
US 2012/0018187 A1    Jan. 26, 2012

(30) Foreign Application Priority Data
Apr. 8, 2009   (DE) .......................... 10 2009 016 842

(51) Int. Cl.
*H02G 3/08*   (2006.01)

(52) U.S. Cl.
USPC .......... 174/50; 174/520; 174/72 B; 174/71 B; 361/600; 361/611; 361/637; 29/825

(58) Field of Classification Search
USPC ..... 174/50, 17 R, 520, 549, 68.1, 72 B, 71 B; 361/600, 601, 633, 637, 648, 679.01, 361/611; 29/825
See application file for complete search history.

(56) References Cited

U.S. PATENT DOCUMENTS

| | | | | |
|---|---|---|---|---|
| 4,176,243 A | * | 11/1979 | Kovatch et al. | 174/72 B |
| 5,339,518 A | | 8/1994 | Tran et al. | |
| 5,811,733 A | * | 9/1998 | Flaig | 174/72 B |
| 6,552,911 B1 | * | 4/2003 | Haupt et al. | 174/50 |
| 2006/0049493 A1 | | 3/2006 | Lee et al. | |

FOREIGN PATENT DOCUMENTS

| | | |
|---|---|---|
| EP | 0157685 A1 | 10/1985 |
| EP | 0226498 A1 | 6/1987 |
| JP | 2152267 A | 6/1990 |
| JP | 5144989 A | 6/1993 |

OTHER PUBLICATIONS

International Preliminary Report on Patentability, issued by The International Bureau of WIPO, Geneva, Switzerland, dated Oct. 11, 2011, for International Application No. PCT/EP2010/054091; 6 pages.
International Search Report and Written Opinion issued by the European Patent Office, dated Jul. 1, 2010, for related International Application No. PCT/EP2010/054091; 9 pages.
Search Report issued by the German Patent Office, dated Dec. 22, 2009, for Priority Application No. DE102009016842.7; 5 pages.

\* cited by examiner

*Primary Examiner* — Angel R Estrada
(74) *Attorney, Agent, or Firm* — Faegre Baker Daniels LLP

(57) ABSTRACT

With the present invention, conductor grids for electronic housings and a manufacturing method for such conductor grids are provided. According to the invention, the conductor grid is produced from two metal strips (130, 110, 140) welded along the joint edge (150), with only one of the two metal strips needing to have a surface suitable for the wire bonding. The amount of the conventionally used, plated starting material can be considerably reduced in this way.

17 Claims, 2 Drawing Sheets

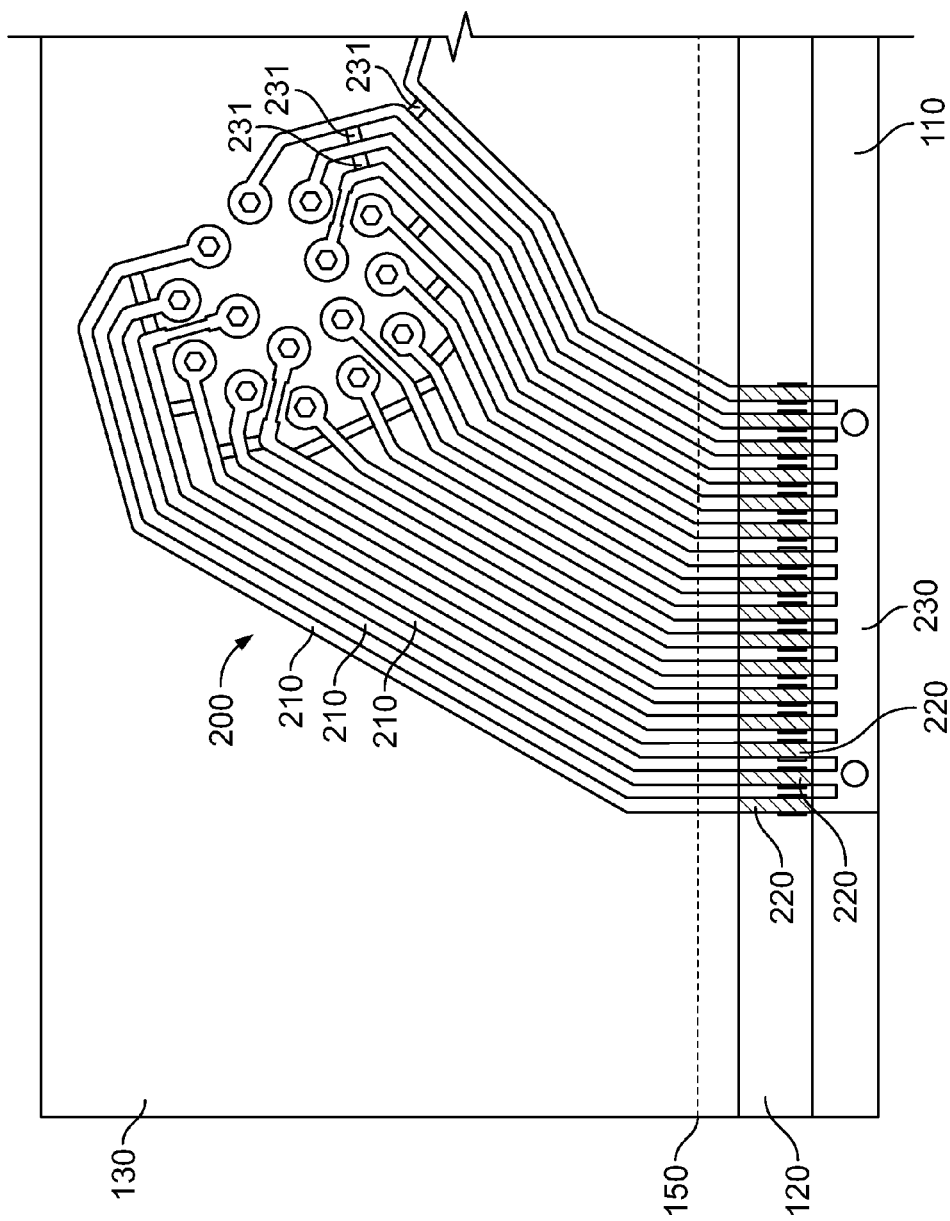

CONDUCTOR GRID FOR ELECTRONIC HOUSINGS AND MANUFACTURING METHOD

The present invention relates to conductor grids for electronic housings, and to a method for manufacturing such conductor grids.

In electronic modules, in particular those for controlling or regulating high currents, such as occur for example in mechatronics, it is known to electrically connect individual components of the module with the aid of cut-out conductor grids. The conductor grids in such modules may assume many functions in addition to the internal electrical contacting, and serve e.g. as supports for individual components instead of a printed circuit board or at the same time as a plug-and-socket connector for external electrical contacting. The entire arrangement consisting of conductor grid and the components connected thereto can be cast in a module housing or be encapsulated with plastics material by injection moulding.

For internal electrical contacting, the individual components, such as discrete components, printed circuit boards, integrated circuits, power ICs, hybrid circuits, etc., can be soldered to the conductor grid. Wire bonding, however, represents one particularly efficient contacting technique, in which the electrical connection is manufactured by means of aluminium wires which are [connected] to the conductor grid or the connection of the corresponding component by pressure welding. The bonding wires in this case have a thickness of typically 50-500 μm.

To manufacture the conductor grids, metal sheets made from copper, iron, or a copper or iron alloy are used as starting material. These materials, although distinguished by good electrical conductivity, are not suitable for wire bonding. In order to be able to weld the bonding wire to the conductor grid by heating or by the action of ultrasound, it is necessary to coat the conductor grid with aluminium, silver or gold.

In particular in the field of mechatronics, therefore, metal strips which are plated in the longitudinal direction with one or more narrow strips of "bonding-capable" metal, e.g. aluminium, are used as starting material for conductor grids. In what is called the clad inlay process, a recess is made in the longitudinal direction in a metal strip made of one of the above alloys, into which recess a thin strip of the bonding-capable metal is pressed. Temperature and pressure produce a metallurgical connection between the two metals. The conductor grid is then cut out from the plated metal strip such that the fingers of the conductor grid extend transversely to the plated metal strip and thus each have a point ("bonding island") with a surface suitable for the wire bonding.

Figure 1:
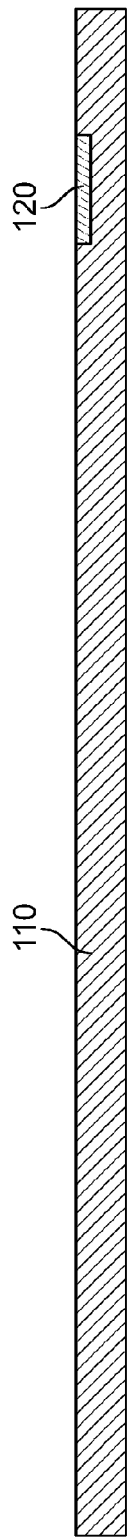

FIG. 1 shows the cross-section through such a metal strip 110, which is plated in the longitudinal direction with a narrow strip 120 of bonding-capable material. The bonding wire with the conductor grid can be welded on to the bonding islands formed by this strip after the cutting-out during the course of the wire bonding and thus produce the connections to the electronic components within the housing.

What is disadvantageous about the conventional method is the high cost of the plated starting material.

It is therefore the aim of the present invention to devise an improved manufacturing method for conductor grids.

This is achieved by the features of the independent claims. Preferred embodiments are the subject of the dependent claims.

In such case, it is the particular approach of the present invention to produce the conductor grid from two metal strips welded in the longitudinal direction, with only one of the two metal strips having a bonding-capable surface. The use of the conventional, expensive plated starting material can in this way be considerably reduced.

According to a first aspect of the present invention, a method for manufacturing a conductor grid is devised which is characterised in that the conductor grid is produced from at least one first metal strip and a second metal strip, which are connected by a weld seam, the second metal strip having, at least at points, a surface suitable for wire bonding.

According to a second aspect of the present invention, a conductor grid for electronic housings is devised which is characterised in that it comprises at least one first metal strip and a second metal strip, which are connected by a weld seam, the second metal strip having, at least at points, a surface suitable for wire bonding.

Preferably the first metal strip consists of copper, iron, a copper alloy or an iron alloy. These are the conventional materials for producing conductor grids, which are distinguished by good electrical conductivity.

According to one embodiment of the present invention, the second metal strip likewise consists of copper, iron, a copper alloy or an iron alloy, and is plated, at least at points, with a metal suitable for wire bonding, preferably aluminium. In this embodiment, the second metal strip advantageously takes up less than half the total width of the welded metal strip.

According to a further embodiment of the present invention, the second metal strip consists of a metal suitable for wire bonding, preferably of aluminium or an aluminium alloy. In this case, the second metal strip advantageously takes up more than half the total width of the welded metal strips, preferably ⅔ of the total width.

Preferably, the conductor grid is produced by cutting out the metal strips which are connected by a weld seam, which permits particularly inexpensive production.

Advantageously, the first and the second metal strip are welded with the aid of a laser beam. In this way, the two metal strips can be joined at a high welding speed, with a narrow and slim weld-seam form and low thermal distortion. According to the invention, the weld seam in this case extends along the joint edge of the first and the second metal strip.

Figure 2A:
Figure 2B:
Figure 2C:
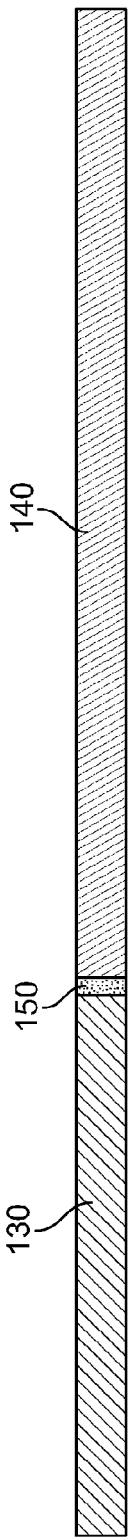

The invention will be described below with reference to the appended illustrations, in which:

FIG. 1 shows a cross-section through a metal strip conventionally used for producing conductor grids, FIG. 2A shows a cross-section through a metal strip which is used according to a first embodiment of the present invention for producing conductor grids, FIG. 2B shows a cross-section through a metal strip which is used according to a second embodiment of the present invention for producing conductor grids, FIG. 2C shows a cross-section through a metal strip which is used according to a third embodiment of the present invention for producing conductor grids, and FIG. 3 shows an example of a conductor grid which is cut out in accordance with the first embodiment of the present invention out of the metal strip shown in FIG. 2A.

According to the invention, instead of the plated metal strip shown in FIG. 1, two metal strips connected by a weld seam are used in order to reduce the amount of plated starting material used.

FIG. 2A shows the cross-section of a metal strip, which is composed according to a first embodiment of the present invention from a single metal strip 130 and a narrow strip 110 of plated sheet metal. The metal strip 130 preferably consists of copper or a standard copper alloy. The second strip 110 likewise preferably consists of copper or a standard copper alloy, with a thin strip 120 of bonding-capable metal being plated into a recess. This thin strip 120 preferably consists of aluminium or an aluminium alloy, and after cutting-out forms the bonding islands, by which the component arranged close to the conductor grid is electrically connected with bonding wires to the conductor grid.

The two metal strips 110 and 130 are connected together mechanically and electrically along the joint edge by a weld seam 150 extending in the longitudinal direction. The welding of the two metal strips can be effected by laser welding or another suitable welding method.

The total width of the welded metal strips may be several cm, typically 100 mm. The width of the strip of plated metal sheet 110 may vary depending on the size of the bonding islands necessary for the wire bonding, but is preferably as narrow as possible, in particular narrower than the single metal strip 130. The bonding zone is typically 4 to 10 mm wide. Inclusive of an allowance for the welding zone and edge regions, the width of the plated metal strip is therefore about 20 mm. For a total width of 100 mm, the saving on material costs is approximately 50%.

FIG. 2B shows the cross-section of a metal strip, which is composed according to a second embodiment of the present invention from two single metal strips 130 and 140. FIG. 2B corresponds to FIG. 2A, with corresponding elements being designated by the same reference numerals.

The metal strip 130 of the second embodiment, as in the first embodiment, preferably consists of copper or a standard copper alloy. The second strip 110, on the other hand, consists uniformly of a metal suitable for wire bonding, preferably aluminium or an aluminium alloy, in particular AlMg3.

The construction of the starting material for producing conductor grids shown in FIG. 2B therefore corresponds to that of the first embodiment, with merely the narrow strip of plated material 110 in FIG. 2A being replaced by a narrow strip of solid, bonding-capable metal 140. The two metal strips 130 and 140, as in the first embodiment, are connected mechanically and electrically by a weld seam 150 extending in the longitudinal direction.

In accordance with the second embodiment, it is therefore possible to dispense completely with the use of plated material, which yields further cost savings. The costs of a metal strip of AlMg3 are for example less than 10% of the costs of an aluminium-plated copper sheet strip.

FIG. 2C shows the cross-section of a metal strip, which according to a third embodiment of the present invention is composed of two single metal strips 130 and 140. FIG. 2C corresponds to FIGS. 2A and 2B, with corresponding elements being designated by the same reference numerals.

The metal strip 130 of the third embodiment, as in the first and second embodiments, preferably consists of copper or a standard copper alloy. The second strip 110, as in the second embodiment, consists uniformly of a metal suitable for wire bonding, preferably aluminium or an aluminium alloy, in particular AlMg3. In contrast to the second embodiment, the second strip, however, is made as wide as possible. The width of the copper sheet strip is reduced accordingly. Preferably copper is only used where an additional electroplated coating, for example with hard gold, silver or tin, is necessary. With such a coating, a further function zone, for example as a plug contact or welded connection, can be produced on the conductor grid.

The two metal strips 130 and 140, as in the first and second embodiments, are connected mechanically and electrically by a weld seam 150 extending in the longitudinal direction.

According to the third embodiment of the present invention, the metal strip 130 of copper or a copper alloy is replaced as far as possible by aluminium or an aluminium alloy. Due to the different material costs for copper and aluminium, this yields a further reduction in costs.

According to the invention, the plated metal strip conventionally used as starting material for producing conductor grids is replaced by a composite material in which two different metal strips are arranged next to each other and are connected by a weld seam along the joint edge. From a production-related point of view, laser welding is a possible solution for this method step. The present invention is however not limited to one specific welding technique. Rather, the advantages of this invention can also be achieved with a different suitable welding technique.

FIG. 3 shows a top view of a example of a conductor grid 200 which is cut out in accordance with the first embodiment of the present invention from the metal strip shown in FIG. 2A. The conductor grid consists of a plurality of individual conductive tracks 210, which are connected together via temporary lands (230, 231). The conductive tracks extend over the weld seam 150 at which the single metal strip 130 and the strip 110 of plated sheet metal are connected together. Due to the plated-in strip of bonding-capable material 120, a bonding island 220 is thus formed on each conductive track.

In summary, it can be established that conductor grids for electronic housings and a manufacturing method for such conductor grids can be provided with the present invention. According to the invention, the conductor grid is produced from two metal strips welded along the joint edge, with only one of the two metal strips needing to have a surface suitable for the wire bonding. The amount of the conventionally used, plated starting material can in this way be considerably reduced.

The invention claimed is:

1. A conductor grid for electronic housings, wherein the conductor grid comprises at least one first metal strip and a second metal strip, which are connected by a continuous weld seam, the second metal strip having, at least at points, a surface suitable for wire bonding, wherein the conductor grid being in the form of a cut-out shaped part of the metal strips which are connected by the continuous weld seam.

2. A conductor grid according to claim 1, the first metal strip is consisting of copper, iron, a copper alloy or an iron alloy.

3. A conductor grid according to claim 1, the second metal strip consisting of copper, iron, a copper alloy or an iron alloy, and being plated, at least at points, with a metal suitable for wire bonding, preferably aluminium.

4. A conductor grid according to claim 3, the second metal strip taking up less than half the total width of the welded metal strips.

5. A conductor grid according to claim 1, the second metal strip consisting of a metal suitable for wire bonding, preferably of aluminium or an aluminium alloy.

6. A conductor grid according to claim 1, the second metal strip (140) taking up more than half the total width of the welded metal strips, preferably ⅔ of the total width.

7. A conductor grid according to claim 1, the first and the second metal strip being welded with the aid of a laser beam.

8. A conductor grid according to claim 1, the weld seam extending along the joint edge of the first and the second metal strip.

9. A method for manufacturing a conductor grid, the conductor grid being produced from at least one first metal strip and a second metal strip, which are connected by a continuous weld seam, the second metal strip having, at least at points, a surface suitable for wire bonding, wherein the conductor grid is produced by cutting out the metal strips which are connected by the continuous weld seam.

10. A manufacturing method according to claim 9, wherein the first metal strip consisting of copper, iron, a copper alloy or an iron alloy.

11. A manufacturing method according to claim 9, wherein the second metal strip is consisting of copper, iron, a copper alloy or an iron alloy and being plated, at least at points, with a metal suitable for wire bonding, preferably aluminium.

12. A manufacturing method according to claim 11, wherein the second metal strip takes up less than half the total width of the welded metal strips.

13. A manufacturing method according to claim 9, wherein the second metal strip is consisting of a metal suitable for wire bonding, preferably of aluminium or an aluminium alloy.

14. A manufacturing method according to claim 13, wherein the second metal strip takes up more than half the total width of the welded metal strips, preferably ⅔ of the total width.

15. A manufacturing method according to claim 9, wherein the first and the second metal strip is welded with the aid of a laser beam.

16. A manufacturing method according to claim 9, wherein the weld seam extends along the joint edge of the first and the second metal strip.

17. A method for manufacturing a conductor grip, comprising the steps of:
   connecting a first metal strip and a second metal strip by a weld seam; and
   cutting out the conductor grid from the connected first and second metal strips, wherein the second metal strip consists of at least one of copper, iron, a copper alloy, and an iron alloy with a thin strip of a metal suitable for wire bonding being plated into a recess.

* * * * *